United States Patent
Lin

(10) Patent No.: US 8,641,469 B2
(45) Date of Patent: Feb. 4, 2014

(54) PACKAGING METHOD OF LIGHT EMITTING DEVICE

(75) Inventor: Chang-Ting Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/541,771

(22) Filed: Jul. 5, 2012

(65) Prior Publication Data

US 2012/0276667 A1 Nov. 1, 2012

Related U.S. Application Data

(62) Division of application No. 12/752,160, filed on Apr. 1, 2010, now Pat. No. 8,242,693.

(30) Foreign Application Priority Data

Dec. 30, 2009 (TW) ................................ 98145958 A

(51) Int. Cl.
*H01J 9/00* (2006.01)

(52) U.S. Cl.
USPC ............................................. 445/25; 445/24

(58) Field of Classification Search
None
See application file for complete search history.

(56) References Cited

U.S. PATENT DOCUMENTS

| | | | |
|---|---|---|---|
| 8,040,587 B2 * | 10/2011 | Palmateer | 359/290 |
| 8,063,561 B2 | 11/2011 | Choi | |
| 2004/0207797 A1 | 10/2004 | Sakurada | |
| 2005/0040762 A1 | 2/2005 | Kurihara | |
| 2009/0064717 A1 | 3/2009 | Son | |
| 2009/0267503 A1 | 10/2009 | Kobayashi | |
| 2012/0164797 A1 * | 6/2012 | Lowenthal et al. | 438/127 |

FOREIGN PATENT DOCUMENTS

TW 200420181 10/2004

* cited by examiner

*Primary Examiner* — Ashok Patel
(74) *Attorney, Agent, or Firm* — Winston Hsu; Scott Margo

(57) ABSTRACT

A packaging method includes the following steps. A cover substrate is provided. A blocking dam having a first height is formed in the peripheral region of the cover substrate. The blocking dam has a second height after being hardened. A sealant surrounding the blocking dam and having a third height is formed. An encapsulation glue is filled in the active region of the cover substrate, and blocked by the blocking dam. A device substrate is provided, and a compression process is performed on the device substrate and the cover substrate. After the compression process, a buffer space is formed between the blocking dam and the sealant and between the cover substrate and the device substrate to accommodate the encapsulation glue spilling out of the active region of the cover substrate. The sealant is hardened, so that the cover substrate and the device substrate are bonded together through the sealant.

8 Claims, 9 Drawing Sheets

PACKAGING METHOD OF LIGHT EMITTING DEVICE

CROSS REFERENCE TO RELATED APPLICATIONS

This application is a divisional of application Ser. No. 12/752,160 filed Apr. 1, 2010, which is incorporated by reference herein in its entirety.

BACKGROUND OF THE INVENTION

1. Field of the Invention

The present invention relates to a cover structure, a package structure of a light emitting device, and a packaging method of a light emitting device, and more particularly to a package structure of a light emitting device having a blocking dam able to prevent an encapsulation glue from being spill and able to serve as a spacer, and a packaging method thereof.

2. Description of the Prior Art

In recent years, electroluminescent display panels such as organic light emitting diode display panels have been widely applied in any kinds of flat-panel display devices due to the advantages such as self-luminescence, wide viewing angle, fast response time, and high light-emitting efficiency.

However, aqueous vapor and oxygen gas will influence electroluminescent components. For example, the light-emitting efficiency and lifetime of organic light emitting diode component will be affected. As a result, how to guarantee the impermeability of the package structure of the light emitting device, to prevent undesirable influences which result from the invasion of the aqueous vapor and the oxygen gas, becomes an important issue in the development of the electroluminescent display panels.

SUMMARY OF THE INVENTION

It is therefore one of the objectives of the present invention to provide a cover structure and a packaging method of a light emitting device to improve the impermeability and the package strength of the package structure of the light emitting device.

According to a preferred embodiment of the present invention, a packaging method of a light emitting device is provided. The packaging method includes the following steps. First, a cover substrate is provided, wherein the cover substrate includes an active region and a peripheral region surrounding the active region. Then, a blocking dam is formed in the peripheral region of the cover substrate, wherein the blocking dam has a first height, and the blocking dam substantially surrounds the active region of the cover substrate. Subsequently, a first hardening process is performed on the blocking dam to harden the blocking dam, and the blocking dam after hardened has a second height. Following that, a sealant is formed in the peripheral region of the cover substrate, wherein the sealant substantially surrounds the blocking dam, the sealant has a third height, and the third height is greater than the second height. Then, an encapsulation glue is filled in the active region of the cover substrate, wherein the encapsulation glue is blocked by the blocking dam, and the encapsulation glue is substantially disposed in the active region of the cover substrate. Subsequently, a device substrate is provided, wherein the device substrate comprises an active region and a peripheral region surrounding the active region, and at least a light emitting device is disposed in the active region of the device substrate. Following that, the active region of the device substrate is corresponding to the active region of the cover substrate, and the peripheral region of the device substrate is corresponding to the peripheral region of the cover substrate. Then, a compression process is performed on the device substrate and the cover substrate, and the sealant of the cover substrate is contacted to the device substrate. Subsequently, a second hardening process is performed on the sealant to harden the sealant, so that the cover substrate and the device substrate are bonded together through the sealant.

In the present invention, the blocking dam after hardened is configured to restrict the encapsulation glue of the light emitting device in the space which is formed by the blocking dam. Accordingly, in the compression process of the device substrate and the cover substrate, the blocking dam will not collapse when squeezed, and the encapsulation glue therefore will not spill. Therefore, the encapsulation glue can effectively cover the light emitting device to prevent the invasion of the aqueous vapor and the oxygen gas which may affect the light-emitting efficiency and lifetime of the light emitting device. In addition, the blocking dam in the compression process can also serve as a spacer to maintain the distance between the device substrate and the cover substrate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, a preferred embodiment will be made in details. The preferred embodiment of the present invention is illustrated in the accompanying drawings with numbered elements.

Figure 1:
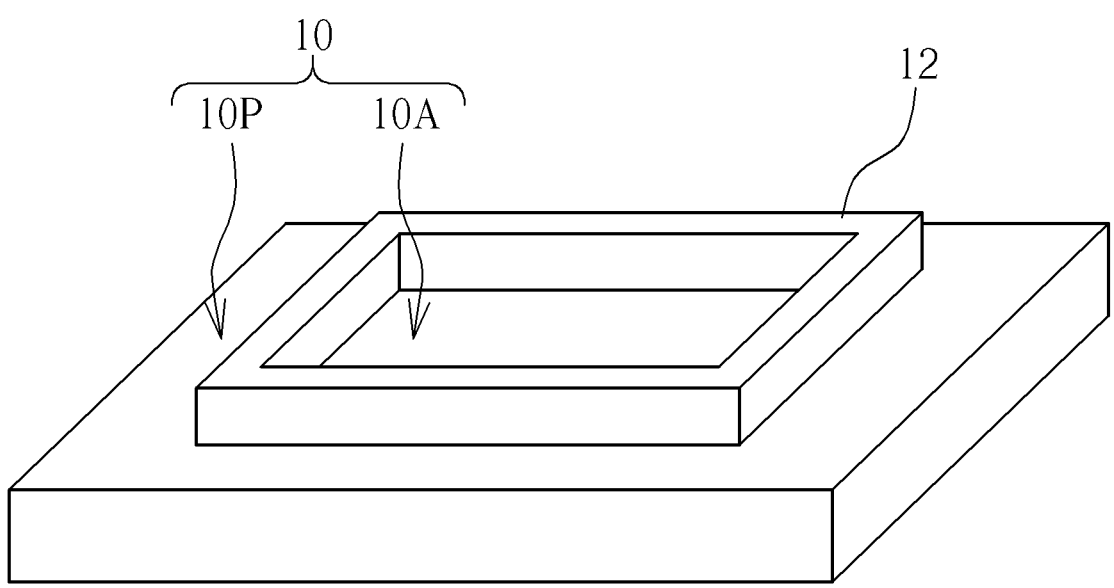
FIGS. 1-9 are schematic diagrams illustrating a packaging method of a light emitting device according to a preferred embodiment of the present invention.
Figure 2:
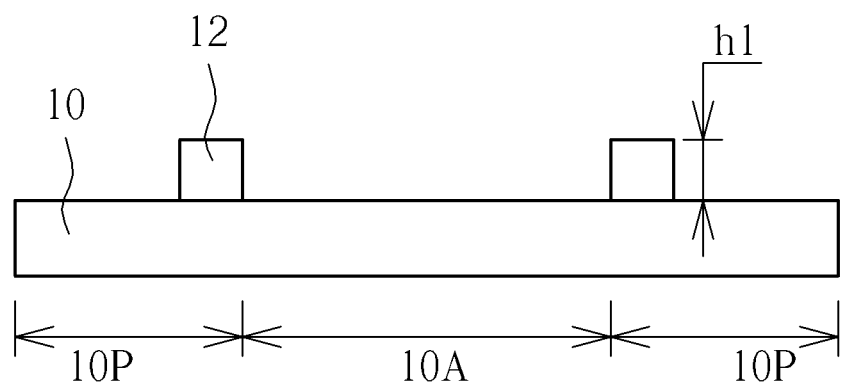
Figure 3:
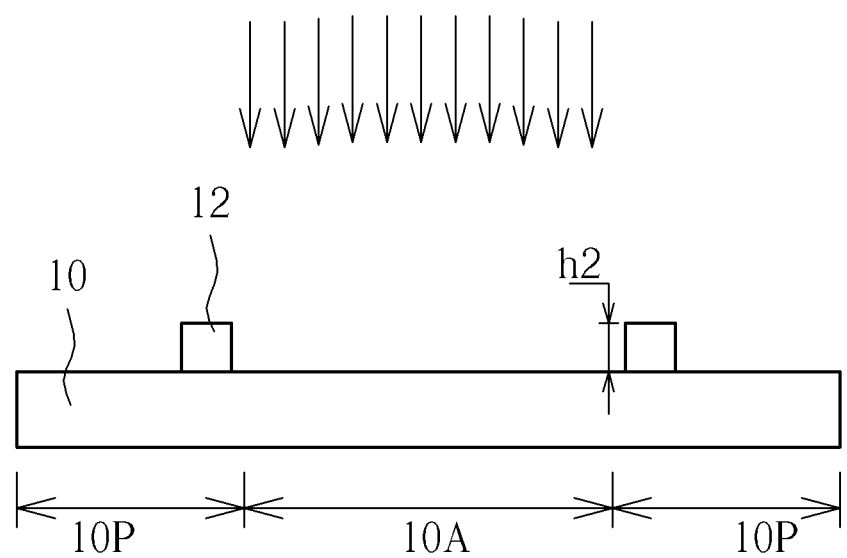
Figure 4:
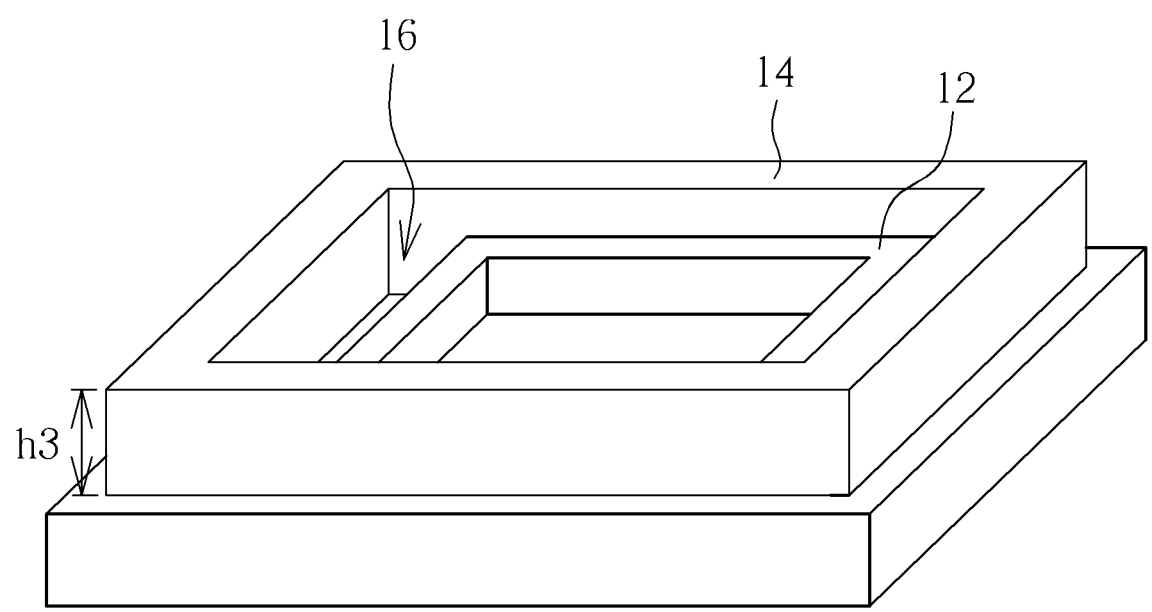
Figure 5:
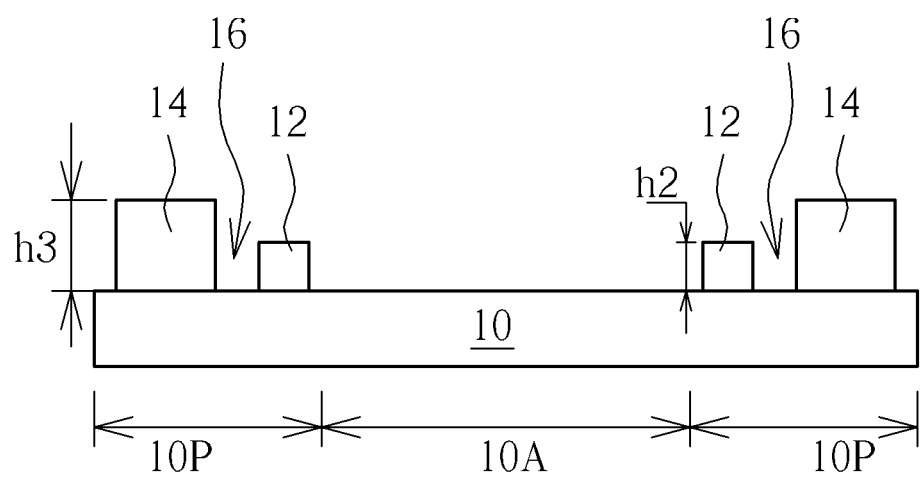
Figure 6:
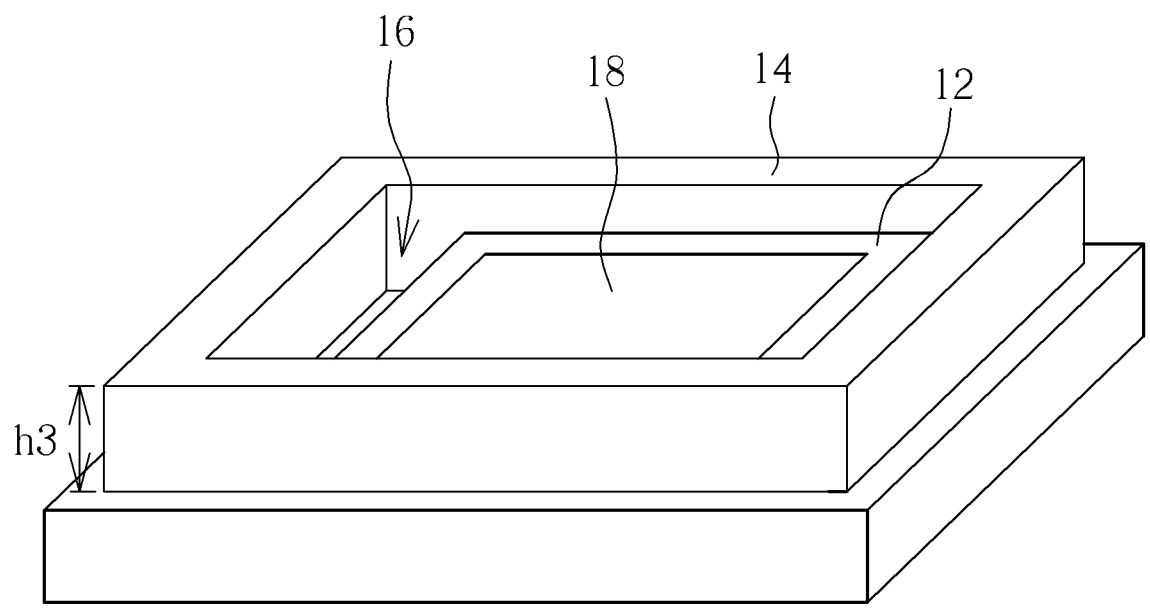

Refer to FIGS. 1-9. FIGS. 1-9 are schematic diagrams illustrating a packaging method of a light emitting device according to a preferred embodiment of the present invention. In order to highlight the features of the present invention, FIG. 1, FIG. 4, and FIG. 6 are illustrated in oblique diagrams. Furthermore, FIGS. 2-3, FIG. 5, and FIGS. 7-9 are illustrated in cross-sectional diagrams. As shown in FIG. 1 and FIG. 2, a cover substrate 10 is provided. The cover structure 10 is configured to encapsulate a device substrate having at least a light emitting device, wherein an active region 10A and a peripheral region 10P are defined on the cover substrate, and the peripheral region 10P surrounds the active region 10A. In the present embodiment, the cover substrate 10 may be a transparent substrate, such as a glass substrate, a plastic substrate, or another suitable transparent substrate, but not limited. Then, a blocking dam 12 is formed in the peripheral region 10P of the cover substrate 10, wherein the blocking dam 12 substantially surrounds the active region 10A. In the present embodiment, the blocking dam 12 preferably has an enclosed pattern, and the blocking dam 12 has a first height h1, wherein the first height h1 is substantially between 6 micrometers and 20 micrometers, but not limited. In addition, the blocking dam 12 can be made of a light-curable material which can be hardened by a light exposing process, but not limited. For example, the blocking dam 12 can be made of a thermal-curable material which can be hardened by a thermal process, or the blocking dam 12 can be made of another material which can be hardened.

As shown in FIG. 3, a first hardening process (as illustrated by arrows in the figure) is subsequently performed on the blocking dam 12 to harden the blocking dam 12, but not limited. As mentioned above, if the blocking dam 12 is made of the light-curable material, the first hardening process can be a light exposing process which utilizes light beams, such as ultraviolet light beams or light beams with another wavelength range, to harden the blocking dam 12. If the blocking dam 12 is made of the thermal-curable material, the first hardening process can be a thermal process which heats the blocking dam 12 up to an appropriate temperature to harden the blocking dam 12. As the material of the blocking dam 12 is different, the first hardening process also can be another hardening process, and the first hardening process is not limited to the light exposing process or the thermal process. In the present embodiment, the shrinkage percentage of the height of the blocking dam 12 after hardened is approximately 4%, and the second height h2 after hardened is slightly less than the first height h1 before the hardening process. For example, in the present embodiment, the second height h2 is substantially between 5 micrometers and 20 micrometers, but not limited.

Following that, as shown in FIG. 4 and FIG. 5, a sealant 14 is formed in the peripheral region 10P of the cover substrate 10, wherein the sealant 14 substantially surrounds the blocking dam 12, the sealant has a third height h3, and the third height h3 is greater than the second height h2. The second height h2 is the height of the blocking dam 12 after hardened. In the present embodiment, the third height h3 of the sealant 14 is substantially between 10 micrometers and 25 micrometers, but not limited. The sealant 14 preferably has an enclosed pattern, but not limited. In addition, a buffer space 16 is formed between blocking dam 12 and the sealant 14 to accommodate the encapsulation glue which may spills out (not shown in the figure).

Figure 7:
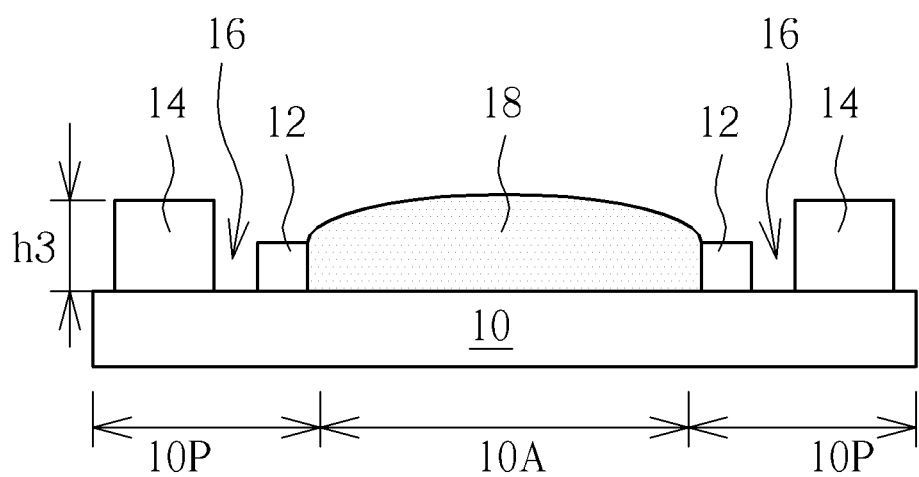

Subsequently, as shown in FIG. 6 and FIG. 7, an encapsulation glue 18 is filled in the active region 10A of the cover substrate 10 to form the cover structure of the present embodiment. Since the blocking dam 12 has an enclosed pattern, the encapsulation glue 18 can be blocked by the blocking dam 12, and the encapsulation glue 18 is substantially disposed in the active region 10A of the cover substrate 10.

Figure 8:
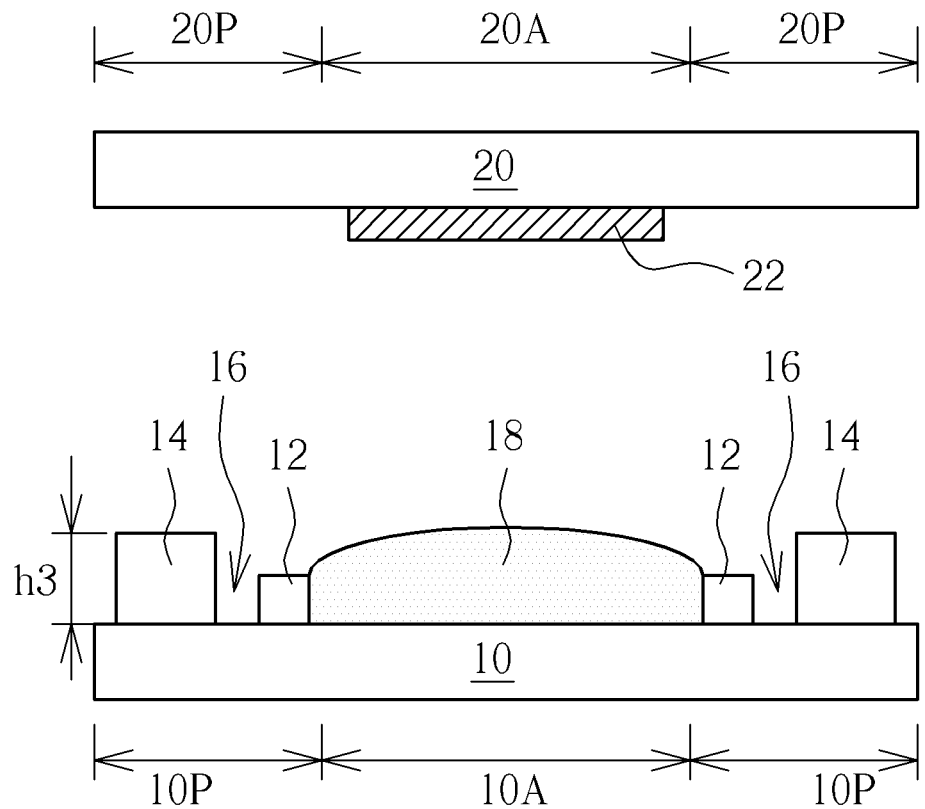

As shown in FIG. 8, a device substrate 20 is provided, wherein at least an active region 20A is defined on the device substrate 20, and at least a peripheral region 20P surrounds the active region. The device substrate 20 further includes at least a light emitting device 22 which is disposed in the active region 20A, and device substrate 20 also includes other necessary components such as switching components (not shown in the figure). In the present embodiment, the device substrate 20 can be the device substrate of an electroluminescent display panel. As a result, the light emitting device 22 can include a plurality of electroluminescent devices, such as organic light emitting diodes, polymer light emitting diodes, or other light emitting devices.

Figure 9:
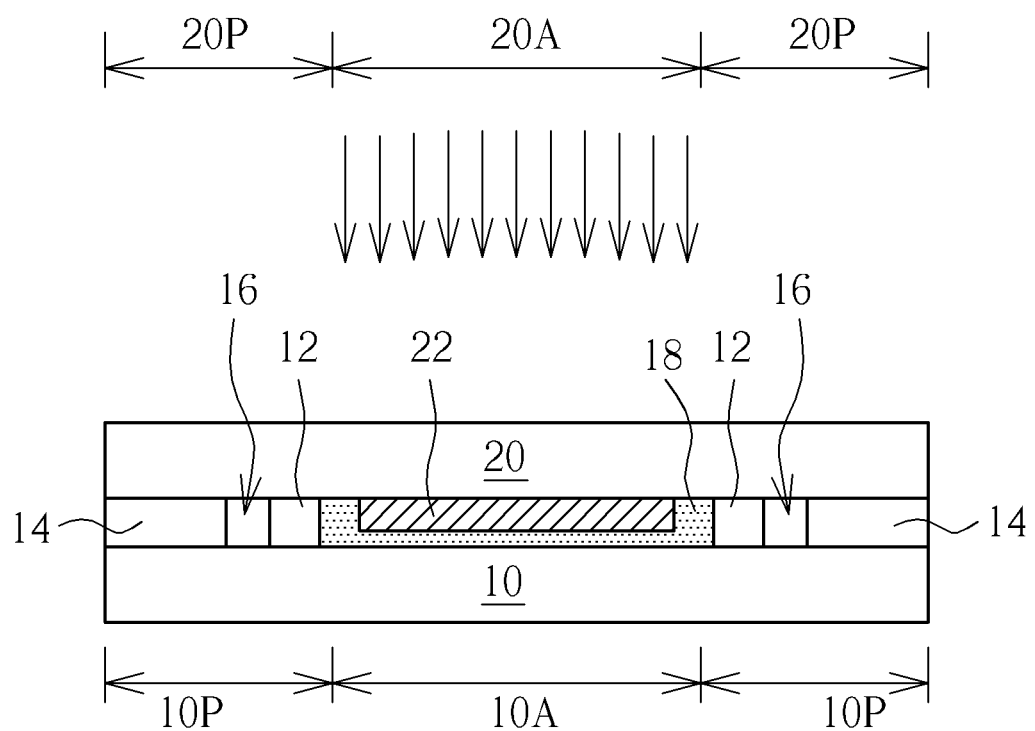

As shown in FIG. 9, the active region 20A of the device substrate 20 is corresponding to the active region 10A of the cover substrate 10, and the peripheral region 20P of the device substrate 20 is corresponding to the peripheral region 10P of the cover substrate 10. Subsequently, a compression process is performed on the device substrate 20 and the cover substrate 10, and the sealant 14 of the cover substrate 10 is contacted to the peripheral region 20P of the device substrate 20. In the compression process, the sealant 14 can be squeezed by the device substrate 20 to be tightly in contact with the device substrate 20. The blocking dam 12 after hardened can serve as a spacer. Therefore, after the sealant 14 is squeezed, the height of the sealant 14 is substantially identical to the height of the blocking dam 12. That is, the height of the sealant 14 may reduce from the third height h3 to the second height h2. Furthermore, in the compression process, the encapsulation glue 18 in the space formed by the blocking dam 12 may cover the light emitting device 22 of the device substrate 20 partially or completely, so that the invasion of the aqueous vapor and the oxygen gas can be avoided. It should be noted that since the blocking dam 12 after hardened has a sufficient degree of hardness, the blocking dam 12 in the compression process may not collapse, by the squeezing of the device substrate 20, to spill the encapsulation glue 18 out, so that the encapsulation glue 18 can effectively cover the light emitting device 22. Moreover, if the amounts of the filling of the encapsulation glue 18 increase due to manufacturing process variation or another factor, the encapsulation glue 18 in the space formed by the blocking dam 12 may slightly spill out. However, a buffer space 16 is formed between blocking dam 12 and the sealant 14 and is formed between the cover substrate 10 and the device substrate 20, so that a small amount of the spilling of the encapsulation glue 18 can flow into the buffer space 16. Following that, a second hardening process (as illustrated by arrows in the figure) is subsequently performed on the sealant 14 to harden the sealant 14, so that the cover substrate 10 and the device substrate 20 are bonded together by virtue of the sealant 14 to form the package structure of the light emitting device of the present embodiment. In the present embodiment, the sealant 14 can be made of a light-curable adhesive material which can be hardened and provide adhesion by a light exposing process, or the sealant 14 can be made of a thermal-curable adhesive material which can be hardened and provide adhesion by a thermal process, but not limited. Therefore, if the sealant 14 is made of the light-curable adhesive material, the second hardening process can be a light exposing process which utilizes light beams, such as ultraviolet light beams or light beams with another wavelength range, to harden the sealant 14. If the sealant 14 is made of the thermal-curable adhesive material, the second hardening process can be a thermal process which heats the sealant 14 up to an appropriate temperature to harden the sealant 14, but not limited.

In conclusion, the blocking dam after hardened is configured to restrict the encapsulation glue of the light emitting device in the space which is formed by the blocking dam. Accordingly, in the compression process of the device substrate and the cover substrate, the blocking dam will not collapse when squeezed, and the encapsulation glue therefore will not spill. Therefore, the encapsulation glue can effectively cover the light emitting device to prevent the invasion of the aqueous vapor and the oxygen gas which may affect the light-emitting efficiency and lifetime of the light emitting device. In addition, the blocking dam in the compression process can also serve as a spacer to maintain the distance between the device substrate and the cover substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A packaging method of a light emitting device, comprising:
    providing a cover substrate, wherein the cover substrate has an active region and a peripheral region surrounding the active region;

forming a blocking dam in the peripheral region of the cover substrate, wherein the blocking dam has a first height and substantially surrounds the active region of the cover substrate;

performing a first hardening process on the blocking dam to harden the blocking dam, and the blocking dam after hardened has a second height;

forming a sealant in the peripheral region of the cover substrate, wherein the sealant substantially surrounds the blocking dam, the sealant has a third height, and the third height is greater than the second height;

filling an encapsulation glue in the active region of the cover substrate, wherein the encapsulation glue is blocked by the blocking dam, and substantially disposed in the active region of the cover substrate;

providing a device substrate, wherein the device substrate has an active region and a peripheral region surrounding the active region, and at least a light emitting device is disposed in the active region of the device substrate;

corresponding the active region of the device substrate to the active region of the cover substrate, corresponding the peripheral region of the device substrate to the peripheral region of the cover substrate, performing a compression process on the device substrate and the cover substrate, and contacting the sealant on the cover substrate to the device substrate, wherein after the compression process, a buffer space is formed between the blocking dam and the sealant and between the cover substrate and the device substrate to accommodate the encapsulation glue spilling out of the active region of the cover substrate; and performing a second hardening process on the sealant to bond the cover substrate and the device substrate together through the sealant.

2. The packaging method of the light emitting device of claim 1, wherein after the compression process, the sealant is squeezed by the device substrate to substantially have the second height identical to the blocking dam.

3. The packaging method of the light emitting device of claim 1, wherein the blocking dam has an enclosed pattern.

4. The packaging method of the light emitting device of claim 1, wherein the first hardening process comprises a light exposing process or a thermal process.

5. The packaging method of the light emitting device of claim 1, wherein the second hardening process comprises a light exposing process or a thermal process.

6. The packaging method of the light emitting device of claim 1, wherein the first height is substantially between 6 micrometers and 20 micrometers.

7. The packaging method of the light emitting device of claim 1, wherein the second height is substantially between 5 micrometers and 20 micrometers.

8. The packaging method of the light emitting device of claim 1, wherein the third height is substantially between 10 micrometers and 25 micrometers.

* * * * *